(12) United States Patent
Tachi et al.

(10) Patent No.: US 9,478,301 B1
(45) Date of Patent: Oct. 25, 2016

(54) SEMICONDUCTOR MEMORY DEVICE

(71) Applicant: KABUSHIKI KAISHA TOSHIBA, Minato-ku (JP)

(72) Inventors: Kiichi Tachi, Kamakura (JP); Masanobu Shirakawa, Chigasaki (JP); Masaki Yoshimura, Kawasaki (JP); Marie Takada, Yokohama (JP); Yoshikazu Harada, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/066,718

(22) Filed: Mar. 10, 2016

Related U.S. Application Data

(60) Provisional application No. 62/213,251, filed on Sep. 2, 2015.

(51) Int. Cl.
| | | |
|---|---|---|
| *G11C 11/34* | (2006.01) | |
| *G11C 16/26* | (2006.01) | |
| *G11C 16/04* | (2006.01) | |
| *G11C 16/14* | (2006.01) | |

(52) U.S. Cl.
CPC ........... *G11C 16/26* (2013.01); *G11C 16/0483* (2013.01); *G11C 16/14* (2013.01)

(58) Field of Classification Search
CPC .............. G11C 16/00; G11C 16/3418; G11C 16/3427
USPC ............... 365/185.17, 185.19, 185.29, 185.3
See application file for complete search history.

(56) References Cited

U.S. PATENT DOCUMENTS

| | | |
|---|---|---|
| 8,503,243 B2 | 8/2013 | Kim |
| 8,520,443 B2 | 8/2013 | Arai et al. |
| 2014/0047168 A1* | 2/2014 | Kim .................... G06F 12/0246 711/103 |
| 2014/0340964 A1 | 11/2014 | Shiino et al. |
| 2015/0071005 A1 | 3/2015 | Maejima et al. |
| 2016/0172045 A1* | 6/2016 | Shukla .................. G11C 16/16 365/185.12 |

FOREIGN PATENT DOCUMENTS

| | | |
|---|---|---|
| JP | 2012-38410 | 2/2012 |
| JP | 2012-69203 | 4/2012 |
| JP | 2014-225310 | 12/2014 |
| JP | 2015-56192 | 3/2015 |

OTHER PUBLICATIONS

U.S. Appl. No. 14/645,740, filed Mar. 12, 2015, Masanobu Shirakawa, et al.

* cited by examiner

*Primary Examiner* — Han Yang
(74) *Attorney, Agent, or Firm* — Oblon, McClelland, Maier & Neustadt, L.L.P.

(57) ABSTRACT

A semiconductor memory device according to an embodiment includes a control circuit, during data write to a memory cell, sequentially executing: an erasing stage in which a threshold value of the memory cell is transitioned into an erase distribution; a preliminary programming stage in which the threshold value is transitioned into a temporal distribution corresponding to write data; and a main programming stage in which the threshold value is transitioned into a program distribution corresponding to the write data, and the control circuit executing a main reading stage, during the data read to a first memory cell, which includes a main reading step of adjusting a read pass voltage to be applied to a neighboring word line based on a magnitude of a threshold value of the neighboring memory cell, and reading whether the first memory cell is an erase level.

20 Claims, 14 Drawing Sheets

FIG. 10
| G<n> | 1 | 2 | 3 | 4 |
|---|---|---|---|---|
| DL<1> | 0 | 0 | 1 | 1 |
| DL<2> | 0 | 1 | 0 | 1 |
FIG. 11
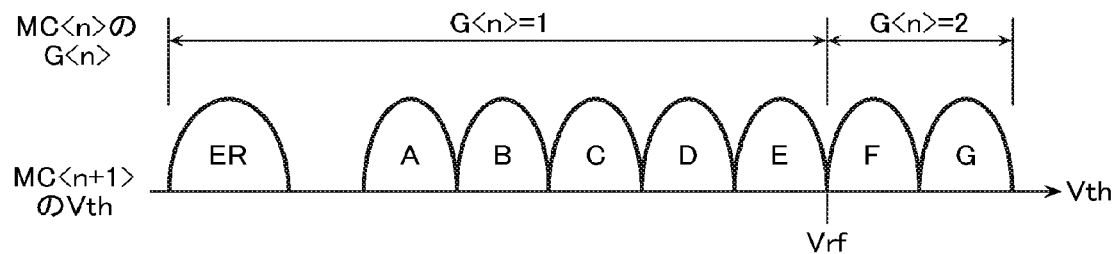
FIG. 12
| G<n> | 1 | 2 |
|---|---|---|
| DL<1> | 0 | 1 |
FIG. 13
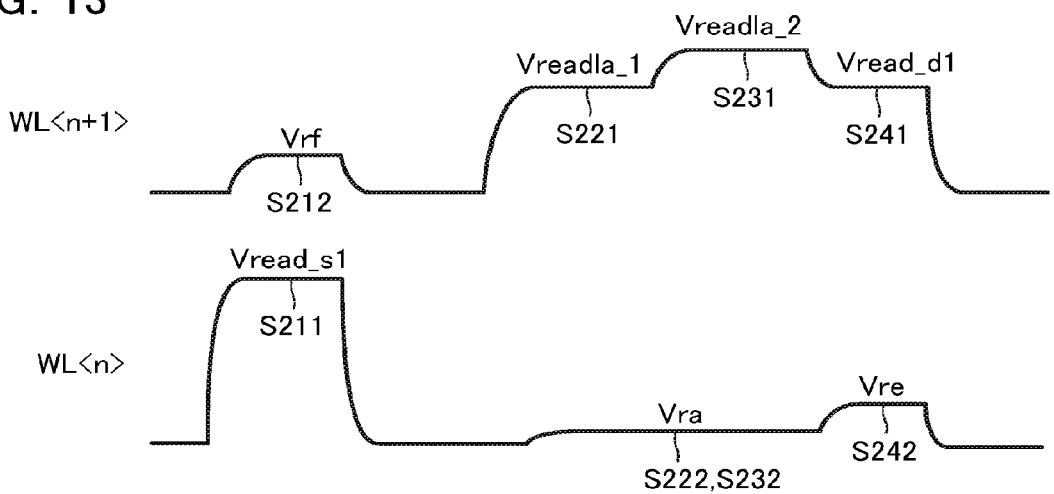

| G1<n>,G2<n> | 1 | 2 |
|---|---|---|
| DL<1> | 0 | 1 |
| DL<2> | 0 | 1 |

SEMICONDUCTOR MEMORY DEVICE

CROSS-REFERENCE TO RELATED APPLICATIONS

This application is based upon and claims the benefit of priority from the prior U.S. Provisional Application 62/213,251, filed on Sep. 2, 2015, the entire contents of which are incorporated herein by reference.

BACKGROUND

1. Field

An embodiment of the present invention relates to a semiconductor memory device.

2. Description of the Related Art

One of semiconductor memory devices is a flash memory. Particularly, a NAND flash memory is widely used in general due to low cost and a large capacity. In addition, many techniques have been suggested so far in order to obtain a larger capacity of the NAND flash memory. For example, miniaturization of a memory cell array and multi-value recording of a memory cell correspond to such techniques.

BRIEF DESCRIPTION OF THE DRAWINGS

FIG. 10 is a diagram illustrating a relationship between a group of the memory cell and a value of a latch circuit in the semiconductor memory device according to the first embodiment.

FIG. 11 is a diagram that describes a relationship between data of a neighboring memory cell and a group of the memory cell in a semiconductor memory device according to a second embodiment.

FIG. 12 is a diagram illustrating a relationship between a group of the memory cell and a value of a latch circuit in the semiconductor memory device according to the second embodiment.

FIG. 13 is a diagram illustrating an operation waveform during data read in the semiconductor memory device according to the second embodiment.

DETAILED DESCRIPTION

A semiconductor memory device according to an embodiment includes: a memory cell array that has a memory string including a plurality of memory cells connected in series, and a plurality of word lines connected to the memory cells; and a control circuit that executes data write and data read to the memory cell, in which one of the memory cells stores data based on a threshold value having a plurality of levels different from each other, the levels include an erase level and a plurality of program levels, the memory cells have an erase distribution corresponding to the erase level and a program distribution and a temporal distribution corresponding to each of the program levels as a threshold distribution, the temporal distribution has a wider width than the corresponding program distribution, the control circuit, during the data write to one of the memory cells, sequentially executes an erasing stage in which the threshold value of the memory cell is transitioned into the erase distribution, a preliminary programming stage in which the threshold value of the memory cell is transitioned into the temporal distribution corresponding to write data, and a main programming stage in which the threshold value of the memory cell is transitioned into the program distribution corresponding to the write data, the memory cells include a first memory cell and a neighboring memory cell which neighbors on the first memory cell, the word lines include a neighboring word line connected to the neighboring memory cell, and the control circuit executes a main reading stage, during the data read to the first memory cell, which includes a main reading step of adjusting a read pass voltage to be applied to the neighboring word line based on a magnitude of a threshold value of the neighboring memory cell, and reading whether the first memory cell is the erase level.

Hereinafter, a description will be given regarding a semiconductor memory device according to an embodiment with reference to the drawings.

First Embodiment

First, a description will be given regarding the entire configuration of a semiconductor memory device according to a first embodiment. Incidentally, a description will be given by exemplifying a NAND flash memory.

Figure 1:
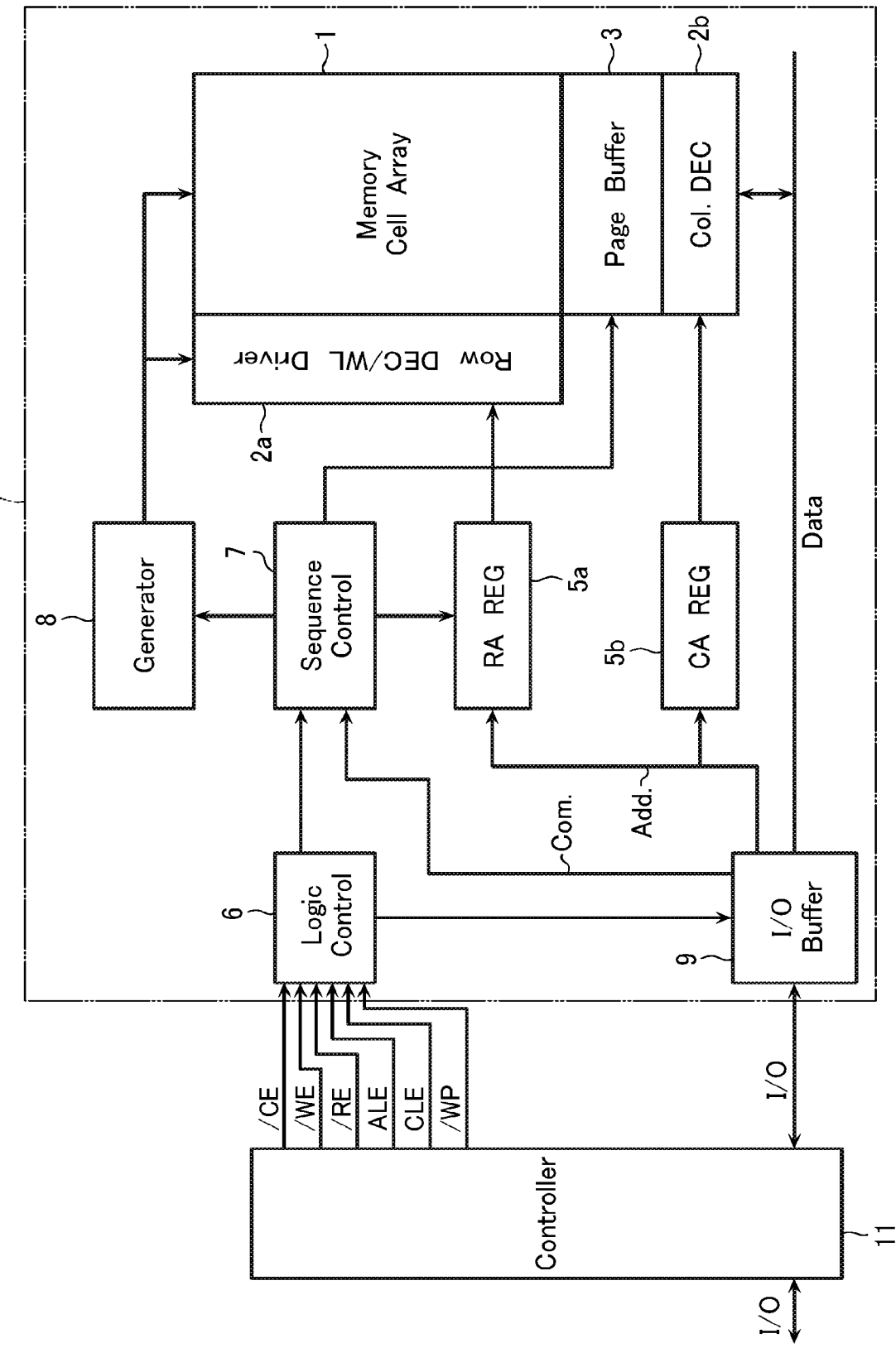
FIG. 1 is a functional block diagram of a semiconductor memory device according to a first embodiment.

FIG. 1 is a functional block diagram of the semiconductor memory device according to the first embodiment.

The semiconductor memory device is provided with a NAND chip 10, and a controller 11 that controls the NAND chip 10.

The NAND chip 10 is provided with a memory cell array 1. The memory cell array 1 has a plurality of bit lines extending in a column direction, a plurality of word lines and source lines in a row direction, and a plurality of memory cells to be selected by the bit line and the word line. The memory cell array 1 will be described later.

Incidentally, data read according to the first embodiment is performed in a unit called a "page", for example. Here, the page also means a unity of the same bits of each memory cell in a case in which multiple bits are stored in one memory cell in some cases. Meanwhile, in embodiments, the latter is distinguished such that a page formed of the lowermost bits will be referred to as an "L (lower) page", a page formed of second bits will be referred to as an "M (middle) page", and a page formed of the uppermost bits will be referred to as an "U (upper) page" in the case of using 3 bit/cell, for example.

In addition, data write according to the first embodiment is performed in units of a memory cell MC group connected commonly to one word line WL. Hereinafter, this unit will be also referred to as a "word line unit" in some cases.

In addition, the NAND chip 10 is provided with a control circuit that executes a read sequence which is a series of processes for the data read and a write sequence which is a series of processes for the data write. The control circuit has a row decoder/word line driver 2a, a column decoder 2b, a page buffer 3, a row address register 5a, a column address register 5b, a logic control circuit 6, a sequence control circuit 7, a voltage generating circuit 8, and an I/O buffer 9.

The row decoder/word line driver 2a drives the word line and a select gate line to be described later, of the memory cell array 1. The page buffer 3 has a sense amplifier circuit and a latch circuit for one page. Read data corresponding to one page held by the page buffer 3 is sequentially selected by a column by the column decoder 2b, and is output to an external I/O terminal via the I/O buffer 9. Write data supplied from the I/O terminal is selected by the column decoder 2b and is loaded to the page buffer 3. The write data corresponding to one page is loaded to the page buffer 3. Row and column address signals are input via the I/O buffer 9, and are transferred respectively to the row decoder 2a and the column decoder 2b. The row address register 5a holds an erase block address in the case of erase of data, and holes a page address in the case of read and write of data. A start column address for loading the write data before initiating the write sequence and a start column address for the read sequence are input to the column address register 5b. The column address register 5b holds the input column address until a write enable/WE or a read enable/RE is toggled according to a predetermined condition.

The logic control circuit 6 controls input of a command or an address, and input and output of data based on a control signal such as a chip enable signal/CE, a command enable signal CLE, an address latch enable signal ALE, a write enable signal/WE, or a read enable signal/RE. A read operation and a write operation are executed by a command. After receiving the command, the sequence control circuit 7 performs a sequence control of read, write, or erase. The voltage generating circuit 8 is controlled by the sequence control circuit 7, and generates a predetermined voltage necessary for various operations.

The controller 11 controls the read sequence and the write sequence according to a condition suitable for the present write state of the NAND chip 10. Incidentally, it is also possible to control some of the read sequence and the write sequence by the control circuit of the NAND chip 10.

Next, the memory cell array 1 will be described.

Figure 2:
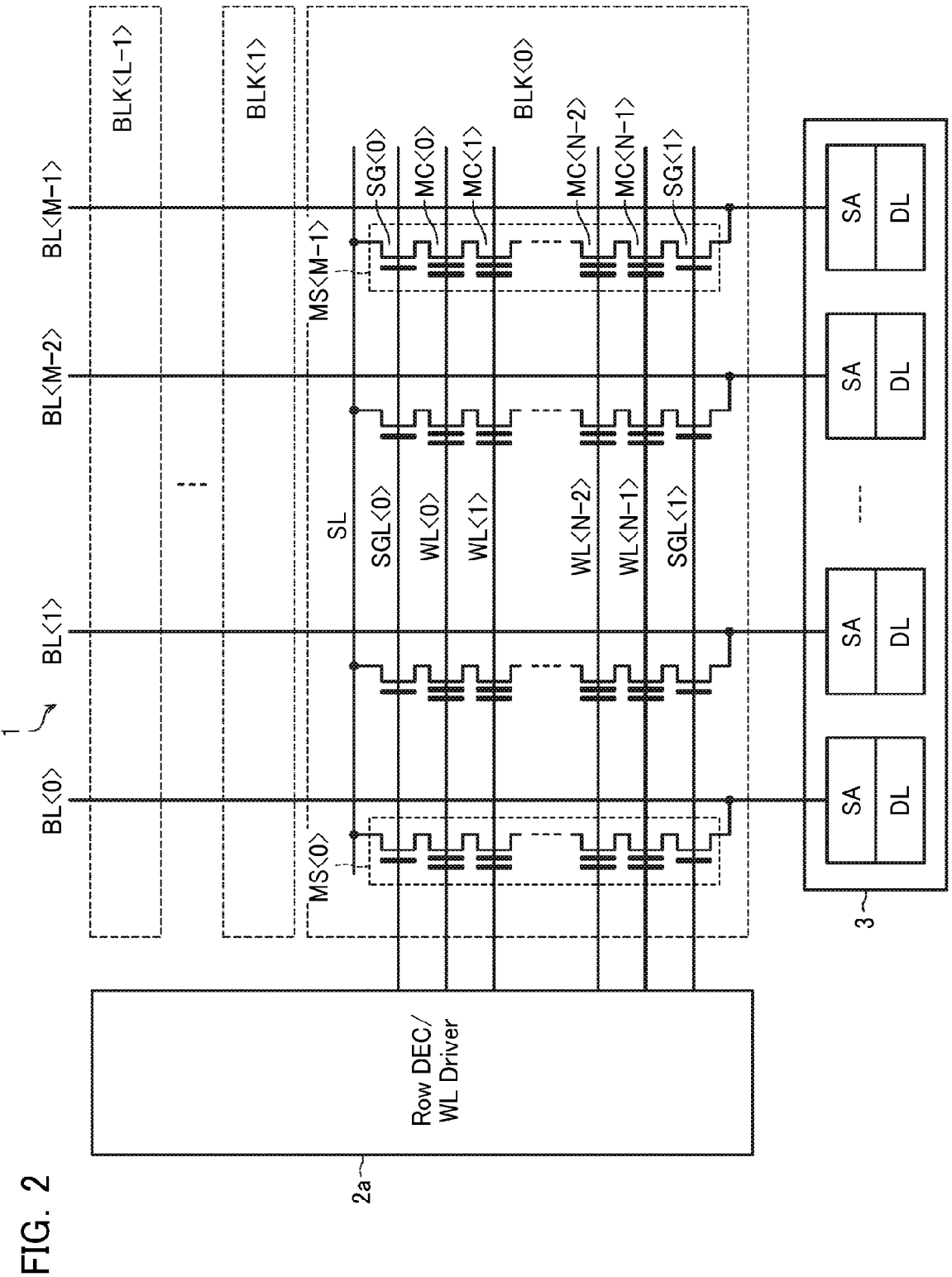
FIG. 2 is a circuit diagram of the memory cell array in the semiconductor memory device according to the first embodiment.

FIG. 2 is a circuit diagram of the memory cell array of the semiconductor memory device according to the first embodiment.

The memory cell array 1 has N word lines WL<0> to <N-1>, select gate lines SGL<0> and <1>, and a source line SL extending in the row direction, and M bit lines BL<0> to <M-1> and M memory strings MS<0> to <M-1> extending in the column direction. Each of the memory strings MS has N memory cells MC<0> to <N-1> connected in series, and select gate transistors SG<0> and <1> connected at both ends thereof. Each of the memory cells MC is configured using a transistor that has a channel on a semiconductor substrate, a charge storage layer (for example, a floating gate) formed on the channel, and a control gate formed on the charge storage layer.

A source of the select gate transistor SG<0> is connected to the source line SL. A drain of the select gate transistor SG<1> is connected to one of the bit lines BL<0> to <M-1>. The control gates of the memory cells MC<0> to <N-1> are connected to the word lines WL<0> to <N-1>. Gates of the select gate transistors SG<0> and <1> are connected to the select gate lines SGL<0> and <1>.

In the above-described configuration, the M memory strings MS<0> to <M-1>, which are arranged in the row direction, configure one block BLK. The block BLK is a unit of collective erase of data. The memory cell array has L blocks BLK<0> to <L-1> arranged in the column direction.

The word line WL and the select gate line SGL are driven by the row decoder 2a In addition, each of the bit lines BL is connected to the sense amplifier circuit S/A of the page buffer 3.

Next, a description will be given regarding data allocation to a threshold distribution of the memory cell MC. In the first embodiment, a description will be given by exemplifying the case of 3 bit/cell.

Figure 3:
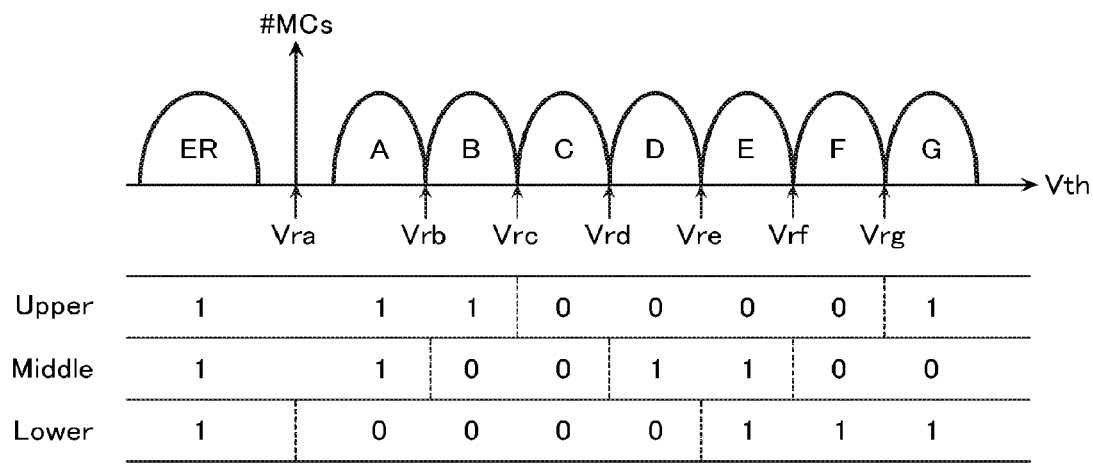
FIG. 3 is a diagram illustrating a relationship between a threshold distribution and data of the memory cell in the semiconductor memory device according to the first embodiment.

FIG. 3 is a diagram illustrating a relationship between the threshold distribution and data of the memory cell in the semiconductor memory device according to the first embodiment.

The memory cell MC according to the first embodiment stores eight-value data based on threshold voltages Vth having different eight levels. These eight levels include an erase level representing the threshold voltage Vth of a case in which data is erased, and seven program levels representing the threshold voltage Vth of a case in which data is programmed. In addition, the memory cells MC has an erase distribution corresponding to the erase level and seven program distributions corresponding to the seven program levels as the threshold distribution. Hereinafter, the erase level and data corresponding thereto will be also referred to as an "ER level", and the seven program levels and data corresponding thereto will be referred to as an "A level" to a "G level" in some cases.

Although there are various data allocation methods to the threshold voltages Vth of the memory cell MC, a data allocation method illustrated in FIG. 3 will be used in the first embodiment. In other words, the eight-value data is allocated to the eight levels such that the ER level='111', the A level='110', the B level='100', the C level='000', the D level='010', the E level='011', the F level='001', and the G level='101'.

Each bit of data is read through size determination using read levels Vra to Vrg, as a reference, set to a boundary between '0' and '1', which is indicated by the broken line in FIG. 3. In the read of the L page, for example, determination on whether the threshold voltage Vth of the memory cell MC is lower than the read level Vra between the ER level and the A level, and determination on whether the threshold voltage Vth of the memory cell MC is upper than the read level Vre between the D level and the E level are executed to determine whether the bit is '1' or '0'. In general, it is considered that an error is likely to occur as the read operation increases, and further, the A-level read and the G-level read are highly likely to cause an error as compared to the other read operation. In regard to such a point, the A-level read is allocated to the L-page read and the G-level read is allocated to the U-page read while increasing the read operations of the M-page read according to the data allocation method illustrated in FIG. 3, and thus, a read error occurrence rate from each page becomes even at some extent. In this manner, it is possible to enhance efficiency of error detection and correction (ECC) to be executed during the data read.

Next, a description will be given regarding the data write to the memory cell MC.

Hereinafter, a memory cell MC<n+1> which belongs to the same memory string MS<m> (m=0 to M−1) as a predetermined memory cell MC<n> (n is an integer among 0 to N−2), and neighbors on the predetermined memory cell MC<n> on the select gate transistor SG<1> side will be referred to as a "neighboring memory cell", and the word line WL which is connected to a neighboring memory cell MC will be referred to as a "neighboring word line" in some cases.

Figure 4:
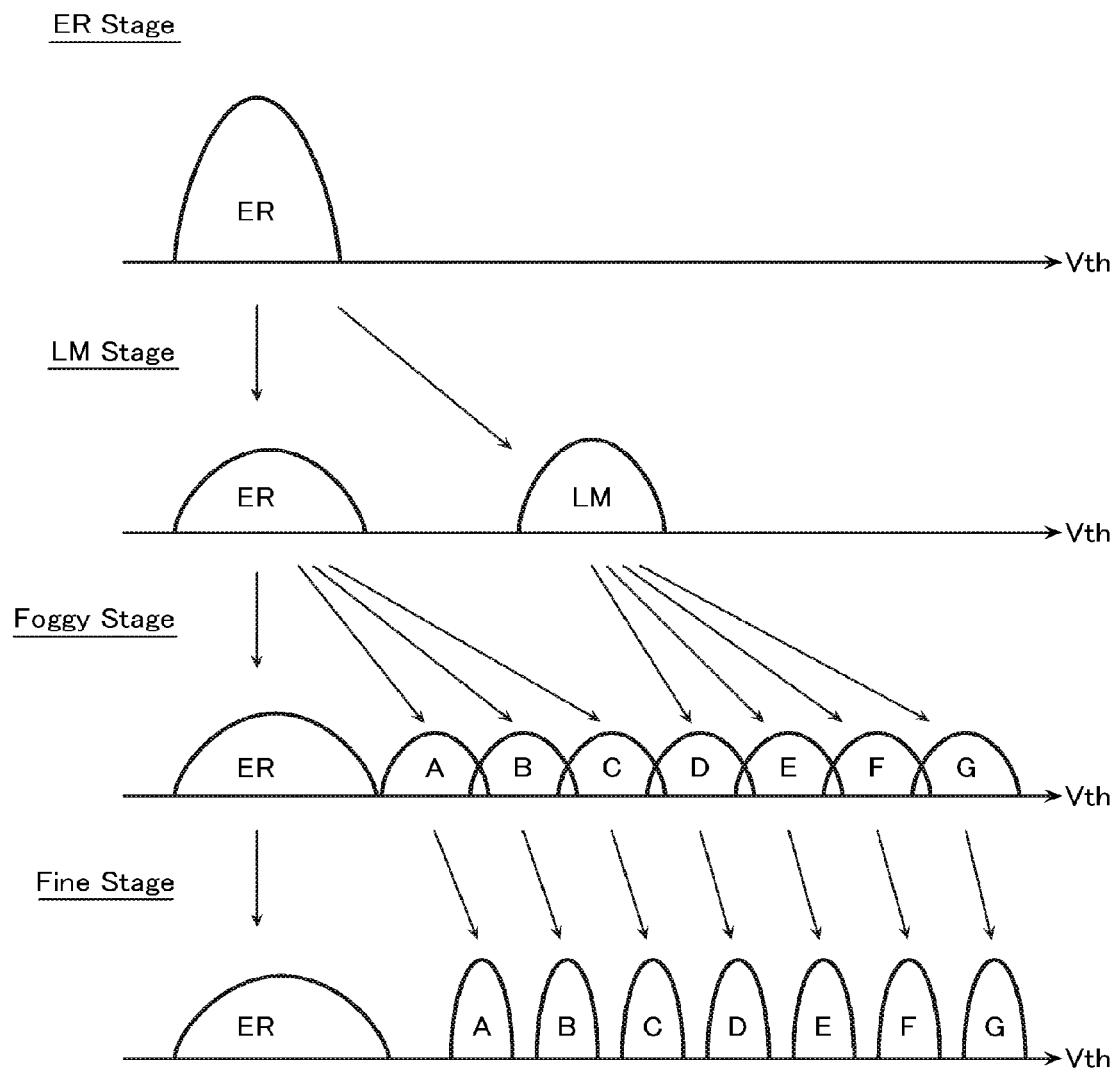
FIG. 4 is a diagram illustrating a state of the threshold distribution of the memory cell during data write in the semiconductor memory device according to the first embodiment.

FIG. 4 is a diagram illustrating a state of the threshold distribution of the memory cell during data writing in the semiconductor memory device according to the first embodiment.

In the first embodiment, the data write to the memory cell MC is realized through the write sequence including an erasing stage (hereinafter, referred to as an "ER stage") and three programming stages. The three programming stages include the intermediate programming stage (hereinafter, referred to as an "LM stage"), the preliminary programming stage (hereinafter, referred to as a "foggy stage"), the main programming stage (hereinafter, referred to as a "fine stage"). Hereinafter, such a system of data write will be referred to as a "three-stage programming system".

The ER stage is a stage in which the memory cell MC is erased to the ER level. The ER stage is executed in units of the memory block MB. The three programming stages to be executed as follows are executed on the assumption of the memory cell MC of the ER level.

The LM stage is a stage in which the memory cell MC having the write data to be programmed to the D to G levels is programmed to the LM level, which is an intermediate level between the ER level and the D level. The three programming stages including the above-described stage are executed in units of the word line.

The foggy stage is a stage in which rough programming depending on the write data is executed to the memory cell MC. To be specific, the threshold voltage Vth of the memory cell MC is transitioned into seven temporal distributions corresponding to the A level to the G level to the memory cells MC having the write data of the A to G levels in the foggy stage. Here, each temporal distribution has a wider width than the corresponding program distribution, and is the distribution having an upper limit low to the same extent. In other words, a plurality of the temporal distributions are set such that a difference between lower limits of the temporal distribution and the program distribution corresponding to a certain level, and a difference between lower levels of the temporal distribution and the program distribution corresponding to another level have the same extent.

The fine stage is a stage in which fine programming depending on the write data is executed to the memory cell MC. To be specific, the memory cell MC having the write data of the A to G levels is programmed to the A level to the G level in the fine stage.

Next, a description will be given regarding an order of executing the three programming stages to the memory cells MC.

Figure 5:
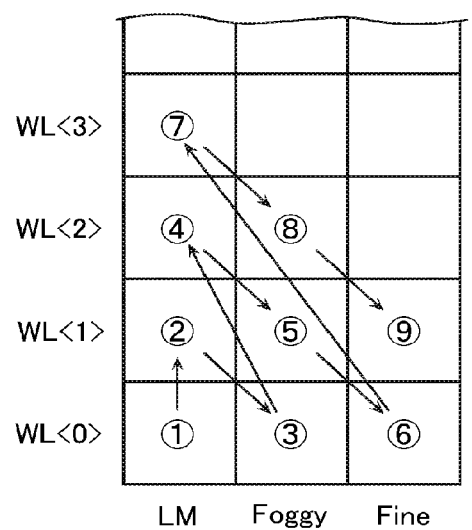
FIG. 5 is a diagram that describes an order of executing programming stages of the semiconductor memory device according to the first embodiment.

FIG. 5 is a diagram that describes the order of executing the programming stages of the semiconductor memory device according to the first embodiment.

The programming stages to the memory cells MC are executed in the order such that the LM stage to the memory cell MC<0> group connected to the word line WL<0>→the LM stage to the memory cell MC<1> group connected to the word line W<1>→the foggy stage to the memory cell MC<0> group→the LM stage to the memory cell MC<2> group connected to the word line WL<2>→the foggy stage to the memory cell MC<1> group→the fine stage to the memory cell MC<0> group→ . . . →the LM stage to the memory cell MC<n+2> group connected to the word line WL<n+2>→the foggy stage to the memory cell MC<n+1> group connected to the word line WL<n+1>→the fine stage to the memory cell MC<n> group connected to the word line WL<n>→ . . . .

In the three-stage programming system, the program is executed in order from the memory cell MC on the source line SL side as a whole when focusing one memory string MS, while the fine stage to the memory cell MC<n> is executed after the foggy stage to the neighboring memory cell MC<n+1> on the bit line BL side in the case of focusing each programming stage. As a result, the influence of the interference effect between cells generated in the memory cell MC<n> is canceled by the LM stage and the foggy stage to the memory cell MC<n+1>.

However, the following problem still remains even in the case of using the three-stage programming system described above.

Figure 6:
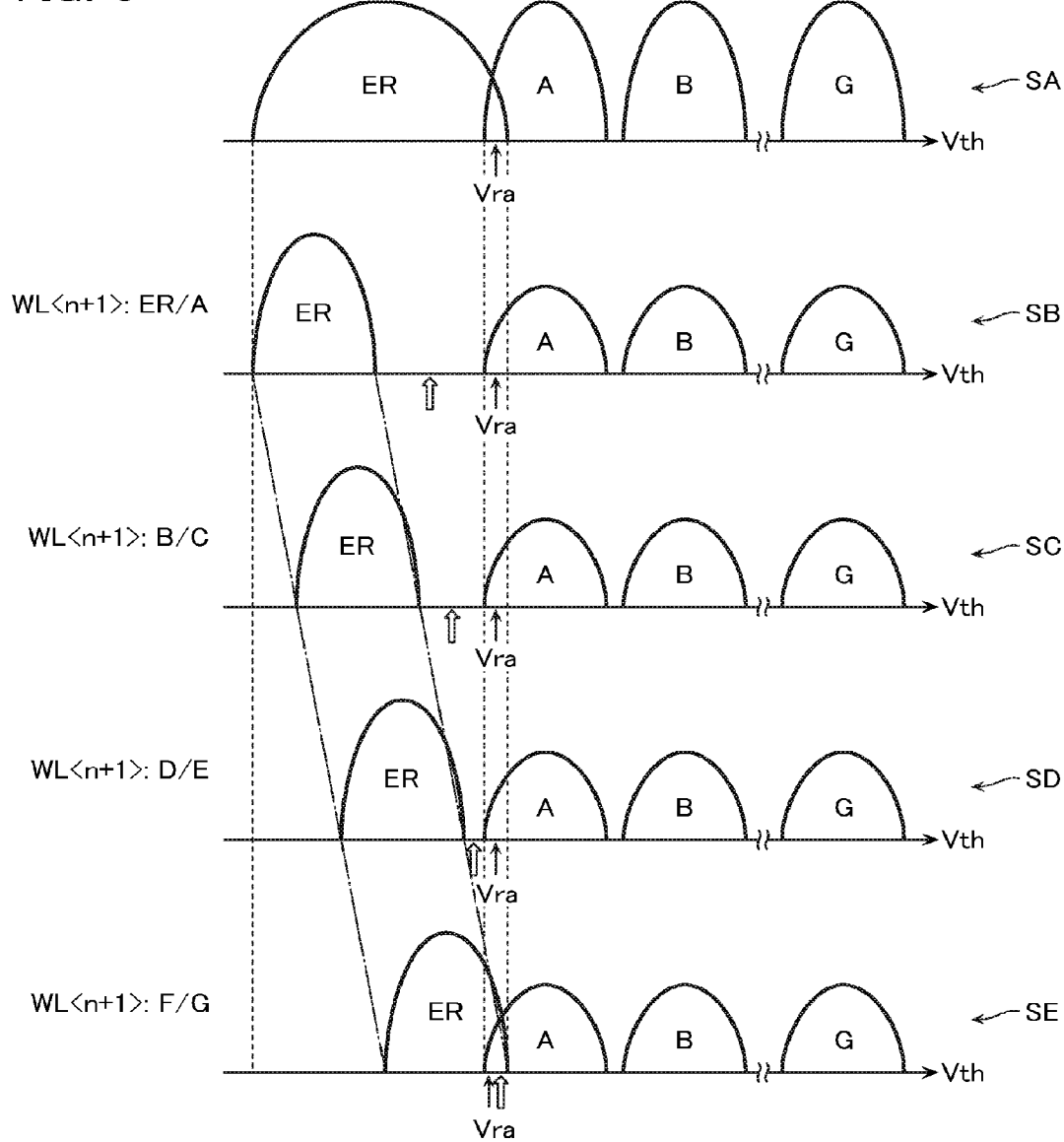
FIG. 6 is a diagram illustrating a relationship of the threshold distribution of the memory cell divided based on data of a neighboring memory cell in the semiconductor memory device according to the first embodiment.

FIG. 6 is a diagram illustrating a relationship of the threshold distribution of the memory cell divided based on data of the neighboring memory cell in the semiconductor memory device according to the first embodiment. Reference sign SA in FIG. 6 represents the entire threshold distribution of the memory cells MC, and reference signs SB, SC, SD and SE in FIG. 6 represent the threshold distributions of the memory cell MC<n> group divided in a case in which the neighboring memory cell MC<n+1> is the ER/A level, the B/C level, the D/E level, and the F/G level among the memory cells MC.

As described above, it is possible to obtain the effect of suppressing the interference effect between cells according to the three-stage programming system by executing the fine stage to the memory cell MC<n> group connected to the word line WL<n> after executing the foggy stage to the memory cell MC<n+1> group connected to the neighboring word line WL<n+1>. In other words, it is difficult to obtain the above-described effect for the memory cell MC to which the fine stage of setting the write data to the ER level is not executed. As a result, the threshold distribution of the ER level is shifted to a positive voltage side depending on intensity of the program to the neighboring memory cell MC<n+1> as illustrated in FIG. 6. Further, a margin between the threshold distributions of the ER level and the A level changes depending on the intensity of the program.

In regard to such a point, it is understood that the read level Vra seems to be suitable when focusing on the entire threshold distribution of the memory cell MC, but, as illustrated in FIG. 6, is not necessarily set to a suitable value when analyzing the threshold distribution based on data of the neighboring memory cell MC<n+1>. Each white arrow in FIG. 6 represents the suitable read level Vra.

Thus, in the first embodiment, the interference effect between cells, which is hardly suppressed by the three-stage programming system, is corrected retroactively through the read sequence to be described next.

The read sequence of the first embodiment corrects the threshold voltage Vth of the focused memory cell MC<n> by adjusting a read pass voltage of the drain side to be applied to the neighboring word line WL<n+1>. In addition, the adjustment of the drain-side read pass voltage aims to solve the problem of the margin between the threshold distributions of the ER level and the A level, and thus, is executed only during the L-page read which only includes the A-level read which reads whether the threshold voltage Vth is the ER level.

To be specific, first, a magnitude of the interference effect between cells that the neighboring memory cell MC<n+1> applies to the memory cell MC<n> is determined based on a height of the threshold voltage Vth of the neighboring memory cell MC<n+1>. The height of the threshold voltage Vth of the neighboring memory cell MC<n+1> is determined using a data D<n+1>. Further, the memory cell MC<n> is grouped based on the magnitude of the interference effect between cells, and then, the drain-side read pass voltage to be applied to the neighboring word line WL<n+1> is adjusted based on a group G<n> thereof. As the interference effect between cells of the threshold voltage Vth increases, the amount of shift to the positive side increases, and thus, the drain-side read pass voltage to be applied to the neighboring word line WL<n+1> also increases the neighboring word line WL<n+1>. In this manner, it is possible to suitably correct the influence of the interference effect between cells to the memory cell MC<n> depending on the intensity thereof.

Figure 7:
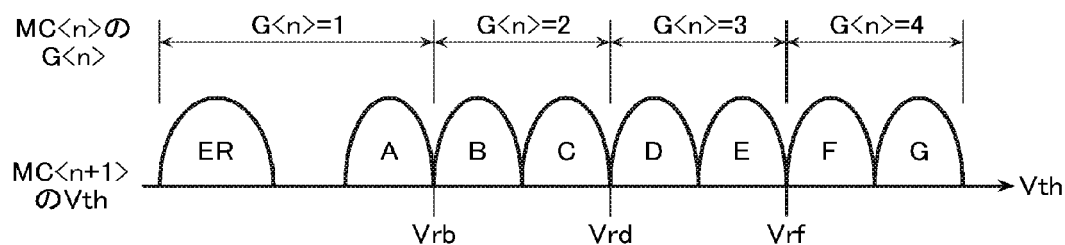
FIG. 7 is a diagram that describes grouping of the memory cell based on the data of the neighboring memory cell in the semiconductor memory device according to the first embodiment.

FIG. 7 is a diagram that describes grouping of the memory cell based on the data of the neighboring memory cells in the semiconductor memory device according to the first embodiment.

The group G<n> of the memory cell MC<n> is set based on the magnitude of the interference effect between cells caused according to the programming stage of the neighboring memory cell MC<n+1>. In other words, the group G<n> is set based on the amount of transition of the threshold voltage Vth to the data D<n+1> which is programmed to the neighboring memory cell MC<n+1> from the ER level.

In the example of FIG. 7, the ER level to the G level of the neighboring memory cell MC<n+1> are divided by two levels, and the group G<n+1> of the memory cell MC<n> is determined depending on the division result. To be specific, the memory cell MC<n> is set to have the group G<n>=1 in a case in which the neighboring memory cell MC<n+1> has the data D<n+1>=the ER level/the A level, the group G<n>=2 in the case of the data D<n+1>=the B level/the C level, the group G<n>=3 in the case of the data D<n+1>=the D level/the E level, and the group G<n>=4 in the case of the data D<n+1>=the F level/the G level.

Figure 8:
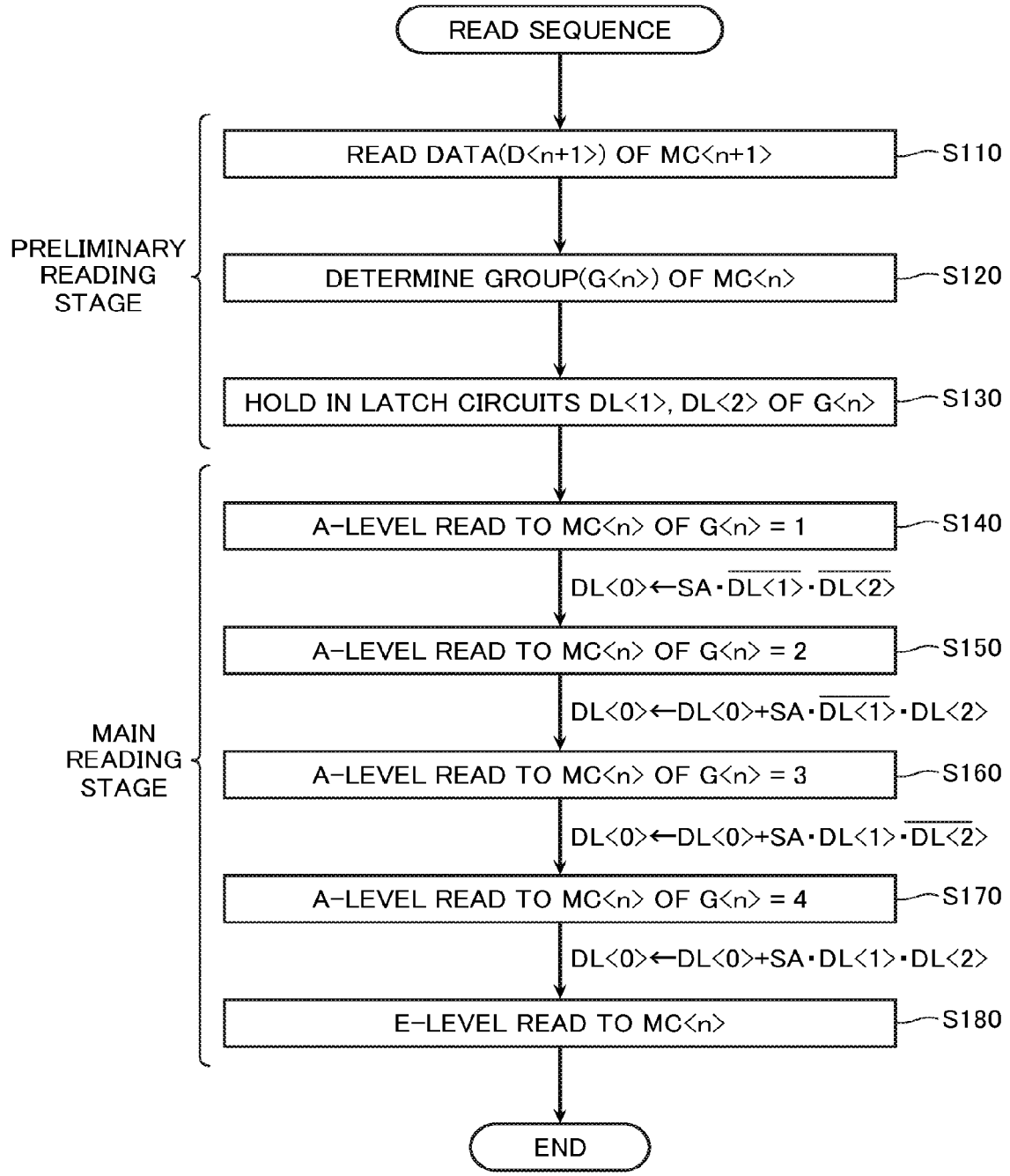
FIG. 8 is a flowchart of data read in the semiconductor memory device according to the first embodiment.
Figure 9:
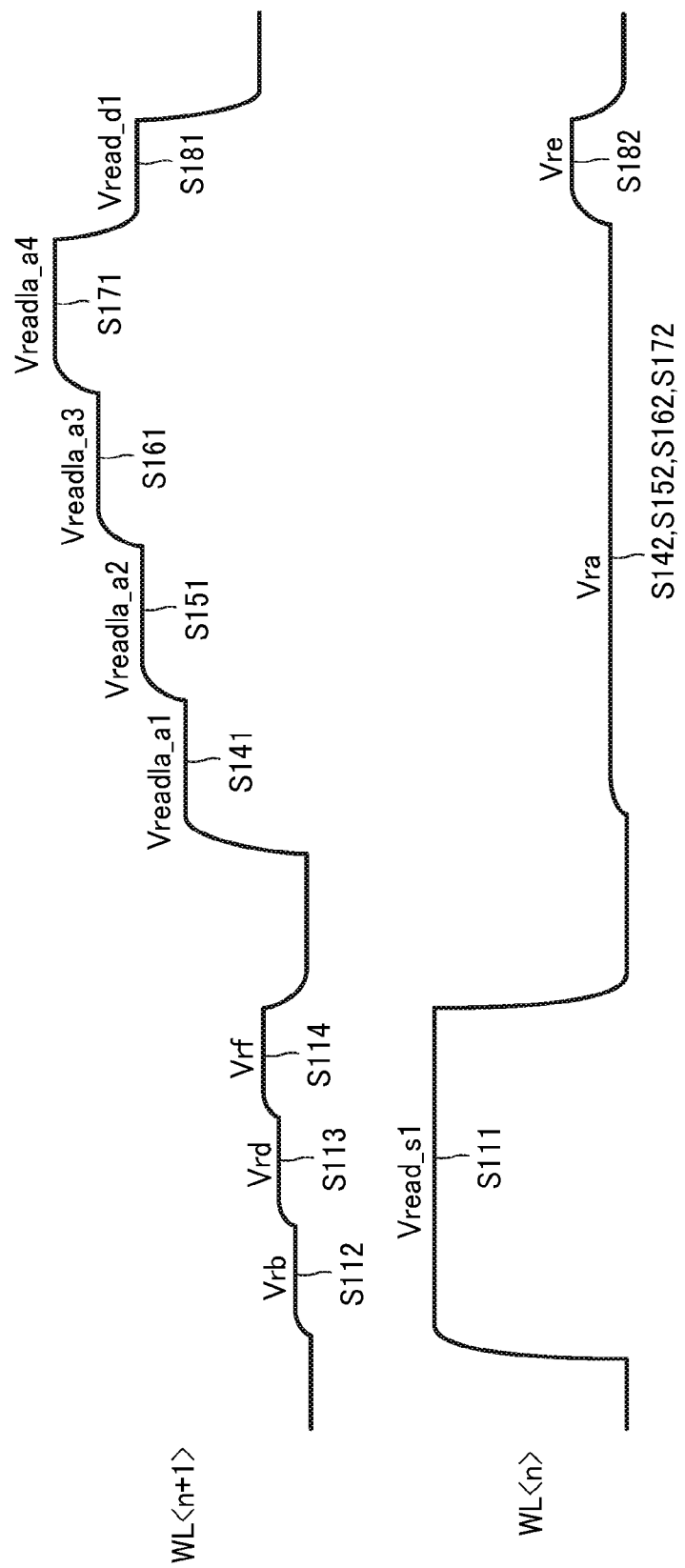
FIG. 9 is a diagram illustrating an operation waveform during the data read in the semiconductor memory device according to the first embodiment.

FIG. 8 is a flowchart of the data read in the semiconductor memory device according to the first embodiment, and FIG. 9 is a diagram illustrating the operation waveform during the data read in the same semiconductor memory device. FIGS. 8 and 9 illustrate the case of the L-page read.

The read sequence according to the first embodiment includes two stages of a preliminary reading stage in which the group G<n> of the memory cell MC<n> is determined, and a main reading stage in which the data of the memory cell MC<n> is read based on a result of the preliminary reading stage.

Steps S110 to S130 of FIG. 8 are included in the preliminary reading stage.

When the read sequence is initiated, first, the data D<n+1> of the neighboring memory cell MC<n+1> is read in Step S110. Here, first, a read pass voltage Vread_s1 is applied to the word line WL<n> (Step S111 in FIG. 9), the read levels Vrb, Vrd and Vrf are sequentially applied to the neighboring word line WL<n+1> (Steps S112 to S114 in FIG. 9). Here, the read pass voltage Vraed_s1 is a higher voltage than an upper limit of the threshold distribution of the G level, which is the highest level. The read pass voltage Vread_s1 is different from a read pass voltage to be applied to the different word line WL, and is independently controlled. The read level Vrb is a voltage between the threshold distributions of the A level and the B level, and the voltage to be used to determine whether the group G<n> is 1, or 2 or more. The read level Vrd is a voltage between the threshold distributions of the C level and the D level, and the voltage to be used to determine whether the group G<n> is 2 or less, or 3 or more. The read level Vrf is a voltage between the threshold distributions of the E level and the F level, and the voltage to be used to determine whether the group G<n> is 3 or less, or 4.

Subsequently, the group G<n> of the memory cell MC<n> is determined based on the data D<n+1> of the neighboring memory cell MC<n+1> in Step S120.

Subsequently, the information of the group G<n> is held in the latch circuit DL of the page buffer 3 in Step S130.

FIG. 10 is a diagram illustrating a relationship between the group of the memory cell and a value of the latch circuit in the semiconductor memory device according to the first embodiment.

In the first embodiment, three latch circuits DL<0> to <2> are prepared for each of the bit lines BL. Further, the latch circuit DL<0> is used to hold the final read data, and the latch circuits DL<1> and <2> are used to hold the information of the group G<n> of the memory cell MC<n> among these latch circuits DL. In Step S130, values to be held in the latch circuits DL<1> and <2> are just as illustrated in FIG. 10.

Steps S140 to S180 of FIG. 8 are included in the main reading stage. Steps S140 to S170 thereof are included in the A-level read to the memory cell MC<n>.

In Step S140, the A-level read to the memory cell MC<n> of the group G<n>=1 is executed. Here, first, a drain-side read pass voltage Vreadla_a1 is applied to the neighboring word line WL<n+1> (Step S141 in FIG. 9), and the read level Vra is applied to the word line WL<n> (Step S142 in FIG. 9). Here, the drain-side read pass voltage Vreadla_a1 a voltage adjusted for a case in which the memory cell MC<n> has the group G<n>=1. Subsequently, the data D<n> of the memory cell MC<n> is detected by the sense amplifier circuit SA. Thereafter, calculation of "DL<0>←SA·/DL<1>·/DL<2>" ('/' represents a negative, and '·' represents a logical multiplication) is performed. The calculation is used to extract only valid data among the data D<n> detected in Step S140, and only the data D<n> of the memory cell MC<n> of the group G<n>=1 is reflected as a value of the latch circuit DL<0>.

Subsequently, the A-level read to the memory cell MC<n> of the group G<n>=2 is executed in Step S150. Here, first, a drain-side read pass voltage Vreadla_a2 is applied to the neighboring word line WL<n+1> (Step S151 in FIG. 9) while maintaining the read level Vra of the word line WL<n> (Step S152 in FIG. 9). Here, the drain-side read pass voltage Vreadla_a2 is a voltage adjusted for a case in which the memory cell MC<n> has the group G<n>=2, and is a value higher than the drain-side read pass voltage Vreadla_a1 of the case of the group G<n>=1. Subsequently, the data D<n> of the memory cell MC<n> is detected by the sense amplifier circuit SA. Thereafter, calculation of "DL<0>←DL<0>+SA·/DL<1>·DL<2>" ('+' represents a logical addition) is executed. From such calculation, only the data D<n> of the memory cell MC<n> of the group G<n>=2 is reflected as a value of the latch circuit DL<0>.

Subsequently, the A-level read to the memory cell MC<n> of the group G<n>=3 is executed in Step S160. Here, first, Here, first, a drain-side read pass voltage Vreadla_a3 is applied to the neighboring word line WL<n+1> (Step S161 in FIG. 9) while maintaining the read level Vra of the word line WL<n> (Step S162 in FIG. 9). Here, the drain-side read pass voltage Vreadla_a3 is a voltage adjusted for a case in which the memory cell MC<n> has the group G<n>=3, and is a value still higher than the drain-side read pass voltage Vreadla_a2 of the case of the group G<n>=2. Subsequently, the data D<n> of the memory cell MC<n> is detected by the sense amplifier circuit SA. Thereafter, calculation of "DL<0>←DL<0>+SA·DL<1>·/DL<2>" is executed. From such calculation, only the data D<n> of the memory cell MC<n> of the group G<n>=3 is reflected as a value of the latch circuit DL<0>.

Subsequently, the A-level read to the memory cell MC<n> of the group G<n>=4 is executed in Step S170. Here, first, Here, first, a drain-side read pass voltage Vreadla_a4 is applied to the neighboring word line WL<n+1> (Step S171 in FIG. 9) while maintaining the read level Vra of the word line WL<n> (Step S172 in FIG. 9). Here, the drain-side read pass voltage Vreadla_a4 is a voltage adjusted for a case in which the memory cell MC<n> has the group G<n>=4, and is a value still higher than the drain-side read pass voltage Vreadla_a3 of the case of the group G<n>=3. Subsequently, the data D<n> of the memory cell MC<n> is detected by the sense amplifier circuit SA. Thereafter, calculation of "DL<0>←DL<0>+SA·DL<1>·DL<2>" is executed. From such calculation, only the data D<n> of the memory cell MC<n> of the group G<n>=4 is reflected as a value of the latch circuit DL<0>.

In the above-described Steps S140 to S170, the drain-side read pass voltage to be applied to the neighboring word line WL<n+1> is adjusted for each of the groups G<n>, and the data D<n> of the memory cell MC<n> of the group G<n> is adopted.

Lastly, the E-level read to the memory cell MC<n> is executed in Step S180. Here, first, a drain-side read pass voltage Vread_d1 is applied to the neighboring word line WL<n+1> (Step S181 in FIG. 9), and the read level Vre is applied to the word line WL<n> (Step S182 in FIG. 9). The drain-side read pass voltage Vread_d1 is different from a read pass voltage to be applied to the different word line WL, and is independently controlled. The read level Vre is a voltage between the threshold distributions of the D level and the E level, is used to determine whether the data D<n> of the memory cell MC<n> is equal to or lower than the D level.

The read sequence according to the first embodiment is described as above.

In the case of the data write of the three-stage programming system, a problem is that the threshold distribution of the ER level is transitioned to the positive voltage side due to the interference effect between cells. However, according to the first embodiment, it is possible to suitably perform the data read on consideration of the intensity of the interference effect between cells by adopting the above-described read sequence.

Incidentally, the processing of the A-level read for each of the groups in the preliminary reading stage and the main reading stage is added in the read sequence according to the first embodiment, but the increase in the processing time for the data read is limited due to such processing is necessary only for the L-page read.

As above, it is possible to provide the semiconductor memory device which uses the data write of the three-stage programming system and causes few errors in the data read according to the first embodiment.

Second Embodiment

A second embodiment is a modified example of the first embodiment. Here, a description will be given regarding a point different from the first embodiment.

FIG. 11 is a diagram illustrating a relationship between data of a neighboring memory cell and a group of the memory cell in a semiconductor memory device according to the second embodiment, and FIG. 12 is a diagram illustrating a relationship between the group and a latch circuit in the same semiconductor memory device.

In the second embodiment, the memory cell MC<n> is divided into the group G<n>=1 receiving a relatively small interference effect between cells and the group G<n>=2 receiving a relatively large interference effect. In the example of FIG. 11, the memory cell MC<n> has the group G<n>=1 in a case in which the neighboring memory cell MC<n+1> has the data D<n+1>=the ER level to the E level, and the group G<n>=2 in a case in which the data D<n+1>=the F level/the G level. In the second embodiment, since the group G<n> has two values, it is enough to provide only the latch circuit DL<1> for one bit in order to hold the information thereof as illustrated in FIG. 12.

FIG. 13 is a diagram illustrating an operation waveform during a read sequence in the semiconductor memory device according to the second embodiment.

In the first preliminary reading stage, the group G<n> of the memory cell MC<n> is determined from the data D<n+1> of the neighboring memory cell MC<n+1>, and the determination result is held in the latch circuit DL<1>. Here, the read pass voltage Vread_s1 is applied to the word line WL<n> (Step S211 in FIG. 13), and the read level Vrf is applied to the neighboring word line WL<n+1> (Step S212 in FIG. 13). Here, the read level Vrf is a voltage between the threshold distributions of the E level and the F level, and the voltage to be used to determine whether the group G<n> is 1 or 2. In the second embodiment, since there are only two groups, it is possible to determine the group G<n> only by the F-level read to the neighboring memory cell MC<n> different from the first embodiment.

In the subsequent main reading stage, the A-level read (Steps S221, 5222, 5231, and 5232 in FIG. 13) and the E-level read (Steps S241 and S242 in FIG. 13) are executed to the memory cell MC<n>. However, the drain-side read pass voltage to be applied to the neighboring word line WL<n+1> is switched only between two steps of Vreadla_a1 and Vreadla_a2 in the A-level read of the second embodiment. Here, the drain-side read pass voltage Vreadla_a1 a voltage adjusted for a case in which the memory cell MC<n> has the group G<n>=1. The drain-side read pass voltage Vreadla_a2 is a voltage adjusted for a case in which the memory cell MC<n> has the group G<n>=2, and is a value higher than the drain-side read pass voltage Vreadla_a1 of the case of the group G<n>=1. Thereafter, the E-level read to the memory cell MC<n> is executed similar to the first embodiment.

In the first embodiment, the memory cell MC<n> has been grouped in a relatively fine manner based on the data of the neighboring memory cell MC<n+1>. However, it is enough to roughly adjust the drain-side read pass voltage to be applied to the neighboring word line WL<n+1> in a case in which there is a large margin between the threshold distributions of the ER level and the A level. In this case, it is possible not only to suppress the influence of the interference effect between cells to some extent, but also to shorten the processing time of the A-level read for each group in the preliminary reading stage and the main reading stage by roughly grouping the memory cell MC<n> as in the second embodiment.

Incidentally, although the grouping is performed with a boundary between the E level and the F level in the example of FIG. 11, the boundary of groups is arbitrary. In addition, the number of groups is also arbitrary. That is, the number of groups may be reduced, as in the second embodiment, or may be increased than that in the case of the first embodiment Third Embodiment In the first and second embodiments, the description has been made regarding the semiconductor memory device which uses the data write of the three-stage programming system. On the other hand, a description will be given regarding a semiconductor memory device which uses data write of a two-stage programming system to be described later in a third embodiment.

First, a description will be given regarding data allocation to a threshold distribution of a memory cell MC. In the third embodiment, a description will be given by exemplifying the case of 2 bit/cell.

Figure 14:
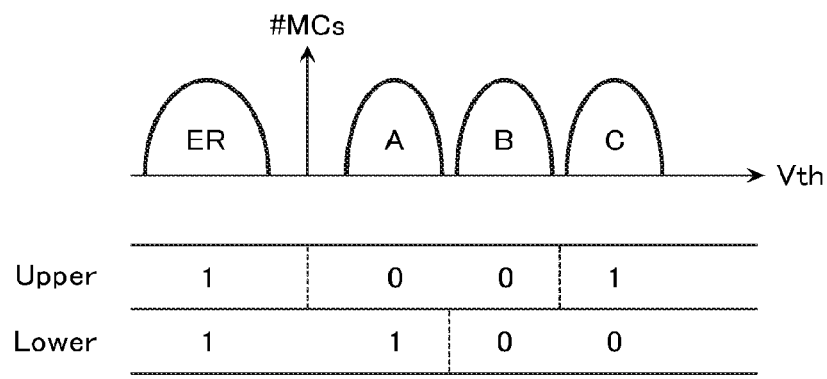
FIG. 14 is a diagram illustrating a relationship between a threshold distribution and data of a memory cell in a semiconductor memory device according to a third embodiment.

FIG. 14 is a diagram illustrating a relationship between a threshold distribution and data of a memory cell in a semiconductor memory device according to a third embodiment; The broken line of FIG. 14 indicates a boundary between '0' and '1' that requires the read operation.

In the example of FIG. 14, the memory cell MC has four levels of the ER level, the A level, the B level, and the C level as the threshold voltage Vth, and allocation is performed to these levels such that the ER level='11', the A level='01', the B level='00', and the C level='10'.

Next, a description will be given regarding the data write to the memory cell MC.

Figure 15:
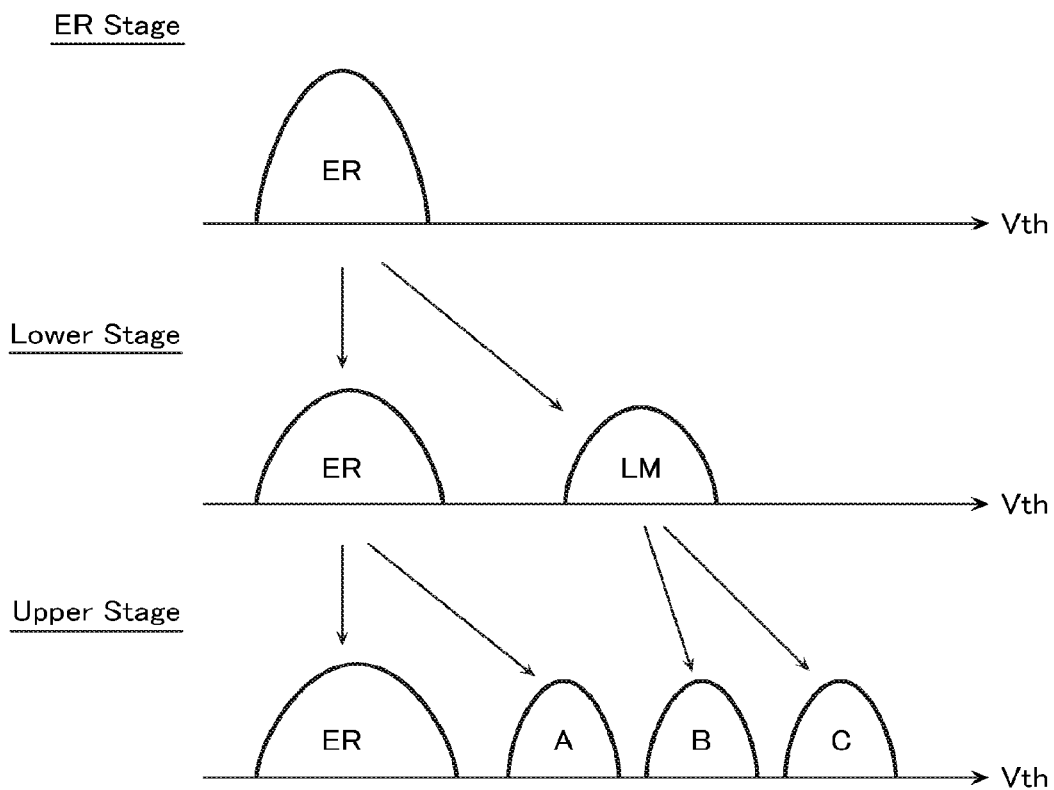
FIG. 15 is a diagram illustrating a state of the threshold distribution of the memory cell during data write in the semiconductor memory device according to the third embodiment.

FIG. 15 is a diagram illustrating a state of the threshold distribution of the memory cell during the data write in the semiconductor memory device according to the third embodiment.

The data write of the third embodiment adopts the two-stage programming system. The two-stage programming approximates a system in which the foggy stage is excluded from the three-stage programming system. To be specific, the two-stage programming system is configured of the ER stage, and two programming stages of a lower stage and an upper stage.

The ER stage is the same as the ER stage in the three-stage programming system.

The lower stage corresponds to the LM stage of the three-stage programming system. In the two-stage programming system, the threshold voltage Vth of the memory cell MC is transitioned to the LM level, which is the intermediate level of the ER level and the B level, to the memory cells MC to which the relatively high B level and C level are programmed.

The upper stage causes the threshold voltage Vth of the memory cell MC to be transitioned to the A level to the memory cells MC to which the A level is programmed among the memory cells MC of the ER level. In addition, the threshold voltage Vth of the memory cell MC is transitioned to the B level or the C level to the memory cells MC of the LM level.

Next, a description will be given regarding an order of executing the two programming stages to the memory cells MC.

Figure 16:
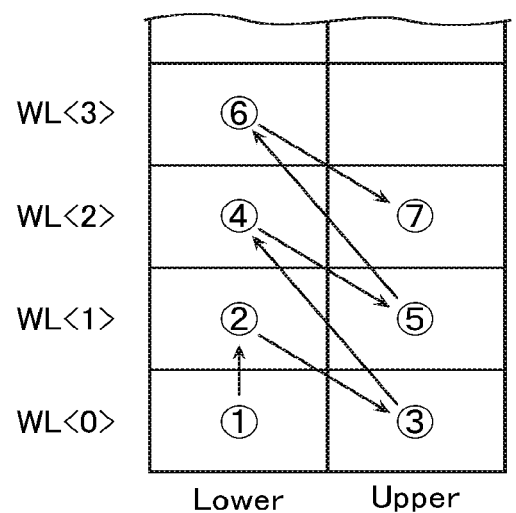
FIG. 16 is a diagram that describes an order of executing programming stages of the semiconductor memory device according to the third embodiment.

FIG. 16 is a diagram that describes the order of executing the programming stages of the semiconductor memory device according to the third embodiment.

The programming stages to the memory cells MC are executed in the order such that the lower stage to the memory cell MC<0> group connected to the word line WL<0>→the lower stage to the memory cell MC<1> group connected to the word line WL<1>→the upper stage to the memory cell MC<0> group→ . . . →the lower stage to the memory cell MC<n+1> group connected to the word line WL<n+1>→the upper stage to the memory cell MC<n> group connected to the word line WL<n>→ . . . .

In the two-stage programming system, the program is executed in order from the memory cell MC on the source line SL side as a whole when focusing one memory string MS, while the upper stage to the memory cell MC<n> is executed after the lower stage to the neighboring memory cell MC<n+1> on the bit line BL side in the case of focusing each programming stage. As a result, the influence of the interference effect between cells generated in the memory cell MC<n> is canceled by the lower stage to the memory cell MC<n+1>.

However, the following problem is generated in the case of using the two-stage programming system described above.

Figure 17:
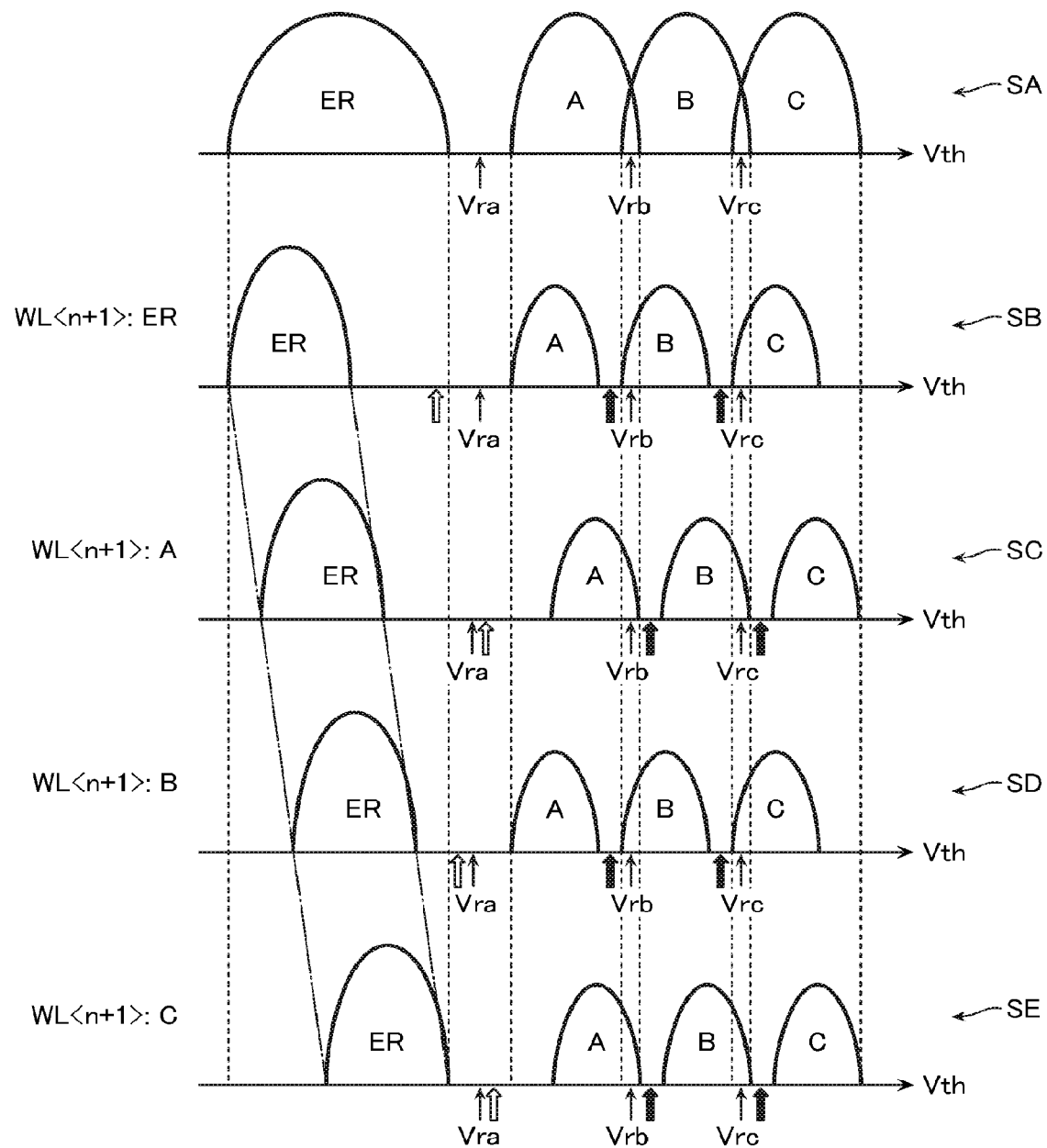
FIG. 17 is a diagram illustrating a relationship of the threshold distribution of the memory cell divided based on data of a neighboring memory cell in the semiconductor memory device according to the third embodiment.

FIG. 17 is a diagram illustrating a relationship of the threshold distribution of the memory cell divided based on data of a neighboring memory cell in the semiconductor memory device according to the third embodiment. Reference sign SA in FIG. 17 represents the entire threshold distribution of the memory cells MC, and reference signs SB, SC, SD and SE in FIG. 17 represent the threshold distributions of the memory cell MC<n> group having the neighboring memory cell MC<n+1> is the ER level, the A level, the B level, and the C level among the memory cells MC.

Similar to the three-stage programming system, the threshold distribution of the ER level is shifted to the positive voltage side due to the interference effect between cells caused in the focused memory cell MC<n> by the lower stage and the upper stage to the neighboring memory cell MC<n+1> also in the two-stage programming system. Further, the intensity of the interference effect between cells is set based on the amount of transition of the threshold voltage Vth to the data D<n+1> which is programmed to the neighboring memory cell MC<n+1> from the ER level as described also in the first embodiment.

In addition, there is no stage that corresponds to the foggy stage of the three-stage programming system in the case of the two-stage programming system. Thus, the amount of transition of the threshold voltage Vth in the upper stage is significantly different depending on the data to be programmed. To be specific, the amount of transition of the threshold voltage Vth of the memory cell MC is larger in the case of the write data of the A level and the C level, than the case of the write data of the ER level and the B level as apparent from FIG. 15. In other words, the intensive programming is required in the upper stage in the former case than the latter case. As a result, the threshold distributions of all the levels are shifted to the positive voltage side in a case in which the neighboring memory cell MC<n+1> has the data D<n+1>=the A level/the C level, more than in a case in which the data D<n+1>=the ER level/the B level.

As above, the threshold distribution of the memory cell MC is shifted depending on at least two factors in the data write of the two-stage programming system, and thus, it is desirable to more finely adjust the drain-side read pass voltage to be used in the read sequence than in the case of using the three-stage programming system.

Thus, in the third embodiment, the interference effect between cells, which is caused in the data write of the two-stage programming system, is corrected retroactively through the read sequence to be described next.

As illustrated in FIG. 17, the threshold distribution of the ER level is shifted to the positive voltage side as the threshold voltage Vth of the neighboring memory cell MC<n+1> increases in the case of the two-stage programming system as indicated by the dashed line in FIG. 17. Thus, it is desirable to use the read level indicated by the white arrow in FIG. 17 as the A-level read. Meanwhile, regarding the program level, a tendency of the shift is different due to the difference in the intensity of the program of the upper stage to the neighboring memory cell MC<n+1> between in a case in which the neighboring memory cell MC<n+1> has the data D<n+1>=the ER level/ the B level, and a case in which the data D<n+1>=the A level/the C level. In other words, as illustrated in FIG. 17, the amount of shift of the threshold distribution is smaller in a case in which the data D<n+1>=the ER level/the B level, than in a case in which the data D<n+1>=the A level/the C level. Thus, it is desirable to use the read level indicated by the black arrow of FIG. 17 in the B-level read and the C-level read.

As above, the group to be used during the A-level read and the group to be used during the B-level read and the C-level read are set separately, and the drain-side read pass voltage is adjusted using the different references in the third embodiment.

Figure 18:
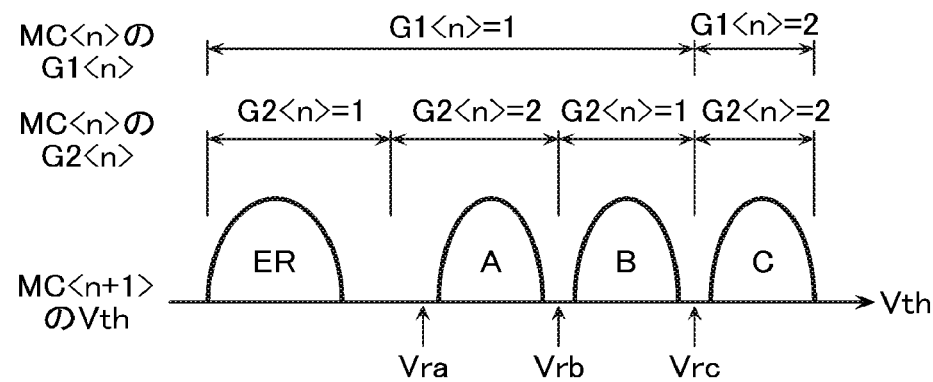
FIG. 18 is a diagram that describes grouping of the memory cell based on the data of the neighboring memory cell in the semiconductor memory device according to the third embodiment.
Figure 19:
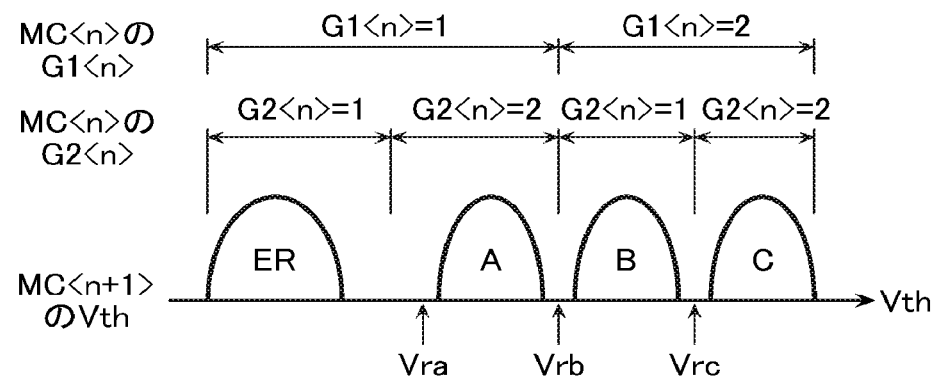
FIG. 19 is a diagram that describes another grouping of the memory cell based on the data of the neighboring memory cell in the semiconductor memory device according to the third embodiment.

FIGS. 18 and 19 are diagrams that describe grouping of the memory cell based on the data of the neighboring memory cell in the semiconductor memory device according to the third embodiment.

In the third embodiment, a group G1<n> and a group G2<n>, which are set using different references, are used.

The group G1<n> is used during the A-level read. The group G1<n> is set based on the height (the data D<n+1>) of threshold voltage Vth of the neighboring memory cell MC<n+1>. In the case of FIG. 18, the group G1<n>=1 in a case in which the data D<n+1>=the ER level to the B level, and the group G1<n>=2 in a case in which the data D<n+1>=the C level.

The group G2<n> is used during the B-level read and the C-level read. The group G2<n> is set based on the amount of transition of threshold voltage Vth of the neighboring memory cell MC<n+1> in the upper stage. In the case of FIG. 18, the group G2<n>=1 in a case in which the data D<n+1>=the ER level/the B level, that is, such a value is small, and the group G2<n>=2 in a case in which the data D<n+1>=the A level/the C level, that is, the value is large.

Incidentally, it is possible to arbitrarily set any data D<n+1> to be used to divide the memory cell MC<n> into the groups without being limited to the case of FIG. 18. For example, as illustrated in FIG. 19, it may be set such that the group G1<n>=1 in a case in which the data D<n+1>=the ER level/the A level, and G1<n>=2 in a case in which the data D<n+1>=the B level/the C level.

Figure 20:
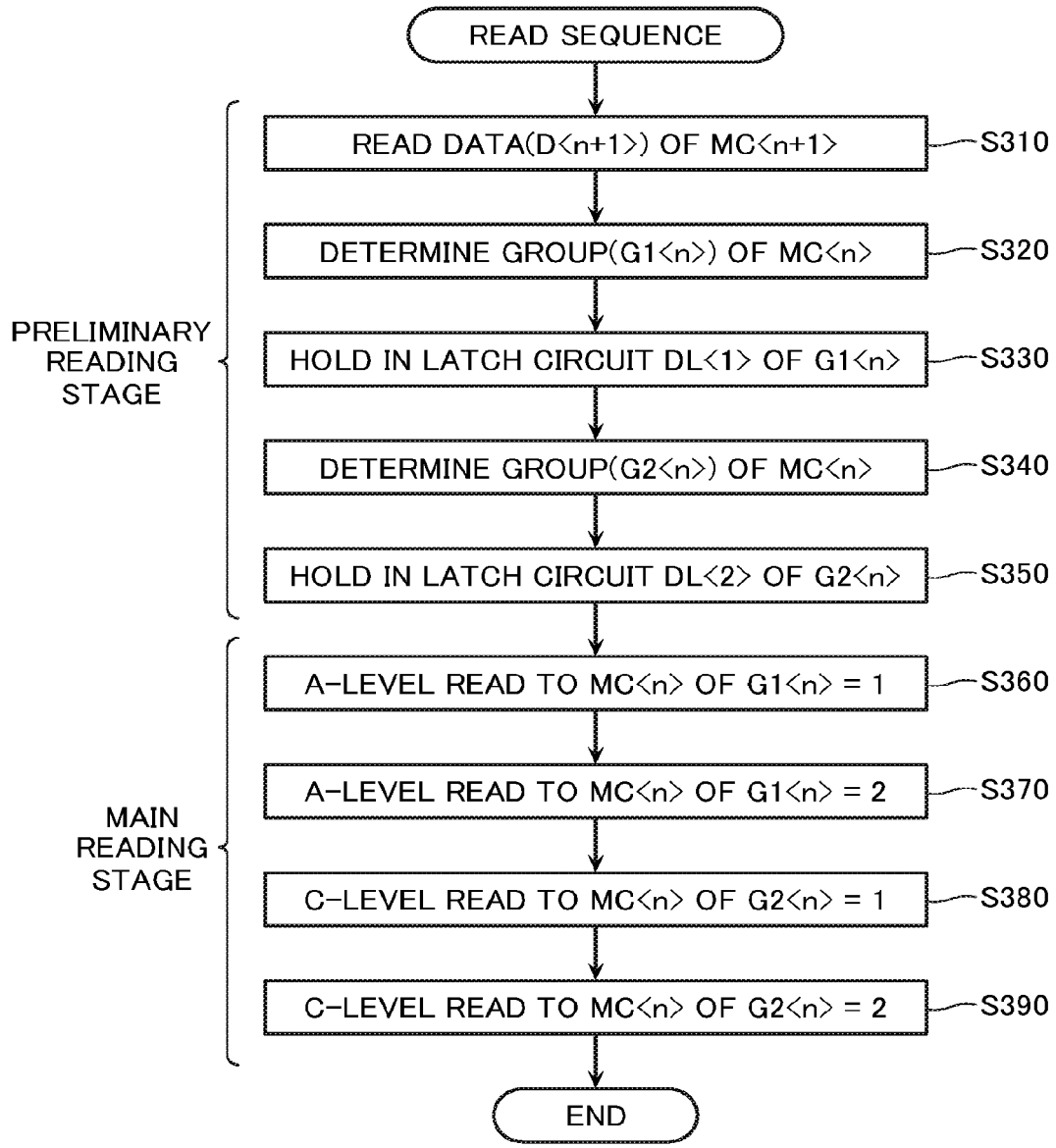
FIG. 20 is a flowchart of data read in the semiconductor memory device according to the third embodiment.
Figures 21, 22:
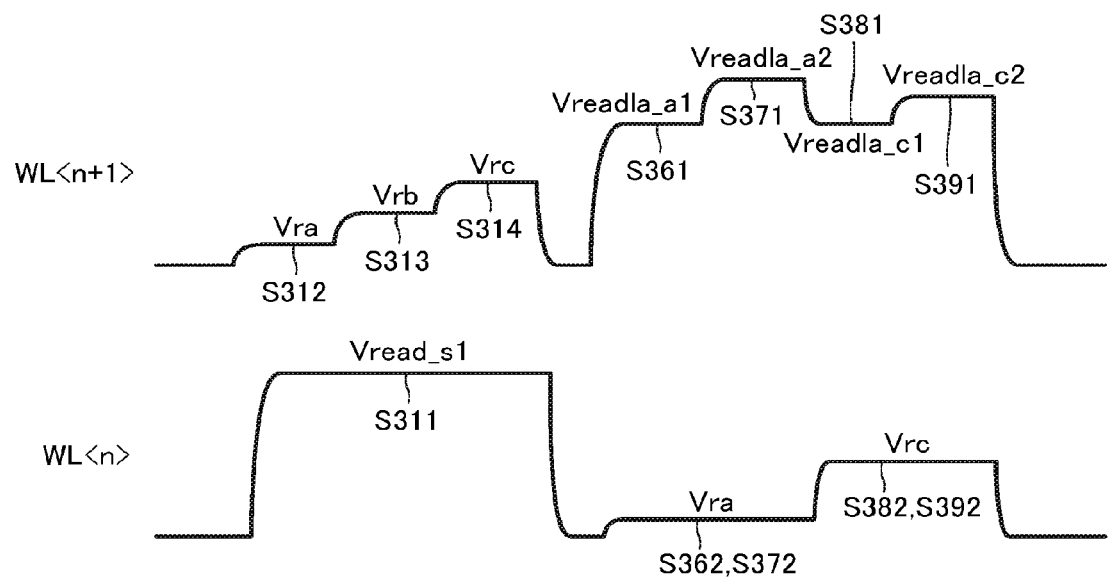
FIG. 21 is a diagram illustrating an operation waveform during the data read in the semiconductor memory device according to the third embodiment.
FIG. 22 is a diagram illustrating a relationship between a group of the memory cell and a value of a latch circuit in the semiconductor memory device according to the third embodiment.

FIG. 20 is a flowchart of the data read in the semiconductor memory device according to the third embodiment, and FIG. 21 is a diagram illustrating the operation waveform during the data read in the same semiconductor memory device. FIGS. 20 and 21 illustrate the case of the U-page read in which the A-level read is executed to the memory cell MC<n>.

The read sequence according to the third embodiment includes two stages of a preliminary reading stage in which the groups G1<n> and G2<n> of the memory cell MC<n> are determined, and a main reading stage in which the data of the memory cell MC<n> is read based on a result of the preliminary reading stage.

Steps S310 to S350 of FIG. 20 are included in the preliminary reading stage.

When the read sequence is initiated, first, the data D<n+1> of the neighboring memory cell MC<n+1> is read in Step S310. Here, first, the read pass voltage Vread_s1 is applied to the word line WL<n> (Step S311 in FIG. 21), the read levels Vra, Vrb and Vrc are sequentially applied to the neighboring word line WL<n+1>, and the A-level read, the B-level read, and the C-level read are sequentially executed to the neighboring memory cell MC<n+1> (Steps S312 to S314 in FIG. 21). Here, the read level Vra is a voltage between the threshold distributions of the ER level and the A level, the read level Vrb is a voltage between the threshold distributions of the A level and the B level, and the read level Vrc is a voltage between the threshold distributions of the B level and the C level. It is possible to determine the data D<n+1> of the neighboring memory cell MC<n+1> through Step S310.

Subsequently, the group G1<n> of the memory cell MC<n> is determined based on the data D<n+1> of the neighboring memory cell MC<n+1>, and the result thereof is held in the latch circuit DL<1> in Steps S320 and S330.

FIG. 22 is a diagram illustrating a relationship between the group of the memory cell and a value of the latch circuit in the semiconductor memory device according to the third embodiment.

In the first embodiment, three latch circuits DL<0> to <2> are prepared for each of the bit lines BL. Further, the latch circuit DL<0> is used to hold the final read data among these latch circuits DL. In addition, the latch circuit DL<1> is used to hold the information of the group G1<n> of the memory cell MC<n>, and the latch circuit DL<2> is used to hold the information of the group G2<n> of the memory cell MC<n>. In Step S330, values to be held in the latch circuit DL<1> are just as illustrated in FIG. 22.

Subsequently, the group G2<n> of the memory cell MC<n> is determined based on the data D<n+1> of the neighboring memory cell MC<n+1>, and the result thereof is held in the latch circuit DL<2> in Steps S340 and S350. In Step S330, values to be held in the latch circuit DL<2> are just as illustrated in FIG. 22.

Steps S360 to S390 of FIG. 20 are included in the main reading stage. Steps S360 and S370 thereof are included in the A-level read to the memory cell MC<n>, and Steps S380 and S390 are included in the C-level read to the memory cell MC<n>.

In Step S360, the A-level read which reads whether the memory cell MC<n> of the group G1<n>=1 is the ER level is executed. Here, first, the drain-side read pass voltage Vreadla_a1, relatively low, is applied to the neighboring word line WL<n+1> (Step S361 in FIG. 21), and the read level Vra is applied to the word line WL<n> (Step S362 in FIG. 21). Subsequently, the data D<n> of the memory cell MC<n> is detected by the sense amplifier circuit SA. Thereafter, calculation is performed using the values of the sense amplifier circuit SA and the latch circuit DL<1>. From such calculation, only the data D<n> of the memory cell MC<n> of the group G1<n>=1 is reflected as a value of the latch circuit DL<0>.

Subsequently, the A-level read to the memory cell MC<n> of the group G1<n>=2 is executed in Step S370. Here, first, the drain-side read pass voltage Vreadla_a2, relatively high, is applied to the neighboring word line WL<n+1> (Step S371 in FIG. 21) while maintaining the read level Vra of the word line WL<n> (Step S372 in FIG. 21). Here, the drain-side read pass voltage Vreadla_a2 is a voltage higher than the drain-side read pass voltage Vreadla_a1 of the case of the group G1<n>=1. Subsequently, the data D<n> of the memory cell MC<n> is detected by the sense amplifier circuit SA. Thereafter, calculation is performed using the values of the sense amplifier circuit SA and the latch circuit DL<1>. From such calculation, only the data D<n> of the memory cell MC<n> of the group G1<n>=2 is reflected as the value of the latch circuit DL<0>.

Subsequently, the C-level read to the memory cell MC<n> of the group G2<n>=1 is executed in Step S380. Here, first, a drain-side read pass voltage Vreadla_c1, relatively low, is applied to the neighboring word line WL<n+1> (Step S381 in FIG. 21), and the read level Vrc is applied to the word line WL<n> (Step S382 in FIG. 21). Here, the drain-side read pass voltage Vreadla_c1 is a voltage lower than the drain-side read pass voltage Vreadla_a2 of the case of the group G1<n>=2. Incidentally, the read pass voltage Vreadla_c1 may be the same as the drain-side read pass voltage Vreadla_a1 of the case of the group G1<n>=1. Thereafter, the data D<n> of the memory cell MC<n> is detected by the sense amplifier circuit SA. Thereafter, calculation is performed using the values of the sense amplifier circuit SA and the latch circuit DL<2>. From such calculation, only the data D<n> of the memory cell MC<n> of the group G2<n>=1 is reflected as the value of the latch circuit DL<0>.

Finally, the C-level read to the memory cell MC<n> of the group G2<n>=2 is executed in Step S390. Here, first, a drain-side read pass voltage Vreadla_c2, relatively high, is applied to the neighboring word line WL<n+1> (Step S391 in FIG. 21) while maintaining the read level Vrc of the word line WL<n> (Step S392 in FIG. 21). Here, the drain-side read pass voltage Vreadla_c2 is a voltage higher than the drain-side read pass voltage Vreadla_c1 of the case of the group G2<n>=1, and is the voltage different from the drain-side read pass voltage Vreadla_a2 of the case of the group G1<n>=2. In the example of FIG. 20, the drain-side read pass voltage Vreadla_a2 is higher than the drain-side read pass voltage Vreadla_c2. Subsequently, the data D<n> of the memory cell MC<n> is detected by the sense amplifier circuit SA. Thereafter, calculation is performed using the values of the sense amplifier circuit SA and the latch circuit DL<2>. From such calculation, only the data D<n> of the memory cell MC<n> of the group G2<n>=2 is reflected as the value of the latch circuit DL<0>.

The read sequence according to the first embodiment is described as above.

In the case of the data write of the two-stage programming system, the influence of the interference effect between cells to the threshold distribution of the ER level and the threshold distributions of the A to C levels are manifested in different tendencies. Thus, it is difficult to perform the suitable adjustment even when the drain-side read pass voltage is uniformly controlled in each read of all the levels. In regard to such a point, the group set by the reference, different from that of another group to be used during the read of another level, is used during the A-level read in the third embodiment, and thus, it is possible to adjust the drain-side read pass voltages which are suitable respectively to the A-level read and the read of the other level.

As above, according to the third embodiment, it is possible to provide the semiconductor memory device which causes few errors in the read, similar to the first and second embodiments, even in the case of using the data write of the two-stage programming system.

[Others]

As above, the description has given regarding certain embodiments of the invention, but these embodiments have been presented only as examples, and are not intended to limit the scope of the inventions. The novel embodiments described herein can be embodied in a variety of other forms, and various omissions, substitutions and changes can be made in the scope not departing from the spirit of the invention. These embodiments and modifications thereof are included in the spirit and scope of the invention as well as in the invention set forth in the appended claims and the scope of equivalents thereof.

What is claimed is:

1. A semiconductor memory device comprising:
   a memory cell array that has a memory string including a plurality of memory cells connected in series, and a plurality of word lines connected to the memory cells; and
   a control circuit that executes data write and data read to the memory cells,
   one of the memory cells storing data based on a threshold value having a plurality of levels different from each other,
   the levels including an erase level and a plurality of program levels,
   the memory cells having an erase distribution corresponding to the erase level and a program distribution and a temporal distribution corresponding to each of the program levels as a threshold distribution, the temporal distribution having a wider width than the corresponding program distribution, the control circuit, during the data write to one of the memory cells, sequentially executing:

an erasing stage in which the threshold value of the memory cell is transitioned into the erase distribution;

a preliminary programming stage in which the threshold value of the memory cell is transitioned into the temporal distribution corresponding to write data; and a main programming stage in which the threshold value of the memory cell is transitioned into the program distribution corresponding to the write data, the memory cells including a first memory cell and a neighboring memory cell which neighbors on the first memory cell, the word lines including a neighboring word line connected to the neighboring memory cell, and the control circuit executing a main reading stage, during the data read to the first memory cell, which includes a main reading step of adjusting a read pass voltage to be applied to the neighboring word line based on a magnitude of a threshold value of the neighboring memory cell, and reading whether the first memory cell is the erase level.

2. The semiconductor memory device according to claim 1, wherein the control circuit executes a preliminary reading stage in which data of the neighboring memory cell is read prior to executing the main reading stage during the data read to the first memory cell.

3. The semiconductor memory device according to claim 2, wherein one of the memory cells belongs to one of a plurality of groups, and the control circuit determines any one of the groups to which the first memory cell belongs based on the data of the neighboring memory cell during the preliminary reading stage.

4. The semiconductor memory device according to claim 3, wherein the control circuit has a latch circuit, and holds information of the group to which the first memory cell belongs in the latch circuit during the preliminary reading stage.

5. The semiconductor memory device according to claim 3, wherein the control circuit adjusts the read pass voltage to be applied to the neighboring word line based on the group to which the first memory cell belongs during the main reading step.

6. The semiconductor memory device according to claim 3, wherein the control circuit adjusts the read pass voltage to be applied to the neighboring word line to a different value at time of reading whether data of the first memory cell is the erase level during the main reading step.

7. The semiconductor memory device according to claim 3, wherein a number of the groups is smaller than a number of the levels.

8. The semiconductor memory device according to claim 3, wherein the read pass voltage to be applied to the neighboring word line increases as the threshold value of the neighboring memory cell increases.

9. The semiconductor memory device according to claim 1, wherein the control circuit adjusts the read pass voltage to be applied to the neighboring word line only one time at time of reading whether data of the first memory cell is the erase level during the main reading step.

10. The semiconductor memory device according to claim 1, wherein one of the memory cells stores eight-value data.

11. A semiconductor memory device comprising:

a memory cell array that has a memory string including a plurality of memory cells connected in series, and a plurality of word lines connected to the memory cells; and a control circuit that executes data write and data read to the memory cell, one of the memory cells storing data based on a threshold value having a plurality of levels different from each other, the levels including an erase level and a plurality of program levels, the memory cells having an erase distribution corresponding to the erase level, a program distribution corresponding to each of the program levels, and an intermediate distribution positioned between the erase distribution and a predetermined one of the program distributions as a threshold distribution, the control circuit, during the data write to one of the memory cells, sequentially executing:

an erasing stage in which the threshold value of the memory cell is transitioned into the erase distribution;

an intermediate programming stage in which the threshold value of the memory cell is transitioned into the intermediate distribution in a case in which write data; corresponds to the program distribution higher than the intermediate distribution; and a main programming stage in which the threshold value of the memory cell is transitioned into the program distribution corresponding to the write data, the memory cells including a first memory cell and a neighboring memory cell which neighbors on the first memory cell, the word lines including a neighboring word line connected to the neighboring memory cell, and the control circuit executing a main reading stage, during the data read to the first memory cell, which includes:

a first main reading step of adjusting a read pass voltage to be applied to the neighboring word line based on a magnitude of a threshold value of the neighboring memory cell, and reading whether the first memory cell is the erase level; and a second main reading step of adjusting the read pass voltage to be applied to the neighboring word line based on an amount of transition of the threshold value of the neighboring memory cell in the programming stage to the neighboring memory cell, and reading whether the first memory cell is a predetermined one of the program levels.

12. The semiconductor memory device according to claim 11, wherein the control circuit executes a preliminary reading stage in which data of the neighboring memory cell is read prior to executing the main reading stage during the data read to the first memory cell.

13. The semiconductor memory device according to claim 12,
wherein one of the memory cells belongs to one of a plurality of first groups, and one of a plurality of second groups, and
the control circuit determines any one of the first groups to which the first memory cell belongs and further determines any one of the second groups to which the first memory cell belongs based on the data of the neighboring memory cell during the preliminary reading stage.

14. The semiconductor memory device according to claim 13,
wherein the control circuit has a latch circuit, and holds information of the first group and the second group to which the first memory cell belongs in the latch circuit during the preliminary reading stage.

15. The semiconductor memory device according to claim 13,
wherein the control circuit adjusts the read pass voltage to be applied to the neighboring word line based on the first group to which the first memory cell belongs during the first main reading step.

16. The semiconductor memory device according to claim 13,
wherein the control circuit adjusts the read pass voltage to be applied to the neighboring word line based on the second group to which the first memory cell belongs during the second main reading step.

17. The semiconductor memory device according to claim 13,
wherein the second groups are different from the first groups.

18. The semiconductor memory device according to claim 13,
wherein the first groups are set based on the magnitude of the threshold value of the neighboring memory cell.

19. The semiconductor memory device according to claim 13,
wherein the second groups are set based on the amount of transition of the threshold value of the neighboring memory cell in the programming stage to the neighboring memory cell.

20. The semiconductor memory device according to claim 11,
wherein one of the memory cells store four-value data.

* * * * *